United States Patent
Knoedgen et al.

(10) Patent No.: US 10,243,451 B1
(45) Date of Patent: Mar. 26, 2019

(54) SYSTEM AND METHOD FOR POWERING A SWITCHING CONVERTER

(71) Applicant: Dialog Semiconductor (UK) Limited, London (GB)

(72) Inventors: Horst Knoedgen, Munich (DE); Christoph N. Nagl, Graz (AT); Nebojsa Jelaca, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/927,275

(22) Filed: Mar. 21, 2018

(51) Int. Cl.
| | |
|---|---|
| *H02M 1/36* | (2007.01) |
| *H02M 1/08* | (2006.01) |
| *H02M 3/07* | (2006.01) |
| *H01L 27/088* | (2006.01) |
| *H03K 17/687* | (2006.01) |
| *H02M 1/00* | (2006.01) |
| *H02M 3/335* | (2006.01) |

(52) U.S. Cl.
CPC .......... *H02M 1/36* (2013.01); *H01L 27/0883* (2013.01); *H02M 1/08* (2013.01); *H02M 3/07* (2013.01); *H03K 17/687* (2013.01); *H02M 3/335* (2013.01); *H02M 3/3353* (2013.01); *H02M 3/33569* (2013.01); *H02M 2001/0006* (2013.01); *H03K 2217/0081* (2013.01)

(58) Field of Classification Search
CPC ........... H02M 3/3353; H02M 3/33569; H02M 3/335; H02M 1/36; H02M 1/08; H02M 3/07; H02M 2001/0006; H03K 2217/0081; H03K 17/687; H01L 27/0883
See application file for complete search history.

(56) References Cited

U.S. PATENT DOCUMENTS

| | | | |
|---|---|---|---|
| 4,772,812 A | 9/1988 | Desmarais | |
| 4,796,174 A | 1/1989 | Nadd | |
| 4,935,647 A | 6/1990 | Larkins | |
| 4,972,162 A | 11/1990 | Banu | |
| 5,285,369 A * | 2/1994 | Balakrishnan | H02M 1/36 323/901 |
| 9,025,348 B2 * | 5/2015 | Ozawa | H02M 1/36 363/21.18 |
| 9,590,507 B1 * | 3/2017 | Herfurth | H02M 3/158 |
| 9,906,140 B2 * | 2/2018 | Zhang | H02M 1/36 |
| 2003/0151448 A1 | 8/2003 | Fujiyama et al. | |
| 2006/0164154 A1 | 7/2006 | Fukami | |

(Continued)

FOREIGN PATENT DOCUMENTS

| | | |
|---|---|---|
| CN | 104836421 | 8/2015 |
| TW | 200845544 | 11/2008 |

*Primary Examiner* — Kyle J Moody
(74) *Attorney, Agent, or Firm* — Saile Ackerman LLC; Stephen B. Ackerman (57) ABSTRACT

A circuit and method for regulating an internal power supply of a switching converter is presented. A switching converter with a depletion mode power switch coupled to an enhancement mode power switch via a switching node and an energy storing element coupled to the depletion mode power switch is provided. The energy storing element may be adapted to provide energy to the switching converter. For instance, the energy storing element may be a capacitor. Optionally, the switching converter may comprise an inductor coupled to the depletion mode transistor, the inductor being adapted to provide an inductor current.

18 Claims, 5 Drawing Sheets

(56) References Cited

U.S. PATENT DOCUMENTS

| | | |
|---|---|---|
| 2007/0070659 A1* | 3/2007 | Sawtell .............. H02M 3/33523 |
| | | 363/21.01 |
| 2008/0290841 A1 | 11/2008 | Chang et al. |
| 2013/0043912 A1 | 2/2013 | Chui et al. |
| 2013/0241601 A1 | 9/2013 | Chen et al. |
| 2014/0055174 A1 | 2/2014 | Knoedgen |
| 2014/0077867 A1 | 3/2014 | Chen |
| 2014/0375361 A1* | 12/2014 | Ausseresse .............. H03K 3/01 |
| | | 327/109 |
| 2015/0194875 A1 | 7/2015 | Jutras |
| 2015/0200583 A1 | 7/2015 | Huang et al. |
| 2015/0222260 A1 | 8/2015 | Genc |
| 2015/0263719 A1 | 9/2015 | Iwamizu et al. |
| 2018/0205312 A1* | 7/2018 | Peng ....................... H02M 1/36 |

\* cited by examiner

FIG. 1 Prior Art

```
                                    ┌─ 210
Providing a depletion mode power switch coupled to an
enhancement mode power switch via a switching node;
                                    │
                                    ▼
                                    ┌─ 220
Charging the energy storing element via a first path
coupling the depletion mode power switch to the energy
storing element; wherein the first path comprises
               a resistance
```

SYSTEM AND METHOD FOR POWERING A SWITCHING CONVERTER

TECHNICAL FIELD

The present disclosure relates to a system and method for powering a switching converter. In particular the present disclosure relates to a system and method for regulating an internal power supply of a switching converter.

BACKGROUND

Power converters are provided with an internal power supply, also referred to as Vcc supply, allowing a number of control functions to be fully operational prior to the initiation of its power stage. Such functions may include fault detection and regulation loop, assuring proper and safe operation of the converter.

Current converters provided with a regulated and stable internal power supply require a dedicated start up circuit which increases the complexity and the cost of the converter.

SUMMARY

It is an object of the disclosure to address one or more of the above-mentioned limitations. According to a first aspect of the disclosure, there is provided a switching converter comprising: a depletion mode power switch coupled to an enhancement mode power switch via a switching node; and an energy storing element coupled to the depletion mode power switch via a first path; wherein the first path comprises a resistance.

For example, the depletion mode power switch may be coupled to a positive voltage and the second power switch may be coupled to a ground. The energy storing element may be adapted to provide energy to the switching converter. For instance, the energy storing element may be a capacitor.

Optionally, the switching converter may comprise an inductor coupled to the depletion mode transistor, the inductor being adapted to provide an inductor current.

Optionally, the first path comprises a first coupling switch.

Optionally, the resistance comprises an internal resistance of the coupling switch. For instance, the internal resistance may be a on-resistance Ron of the first coupling switch.

Optionally, the first coupling switch may be a depletion mode transistor. For example, the first coupling switch may be based on a III/V semiconductor. For instance, the first coupling switch may be a GaN depletion mode transistor.

Optionally, the switching converter comprises a second path coupling the depletion mode power switch to the energy storing element, the second path comprising a second coupling switch.

For example, the second coupling switch may be an enhancement mode transistor. The enhancement mode transistor may have a gate terminal and a drain terminal coupled to each other.

Optionally, the switching converter may be adapted to charge the energy storing element via the first path in a first mode of operation, and via the second path in a second mode of operation. For example, the first mode of operation may be a start-up mode and the second mode of operation may be a normal mode.

Optionally, the enhancement mode power switch and the depletion mode power switch are arranged such that switching the enhancement mode power switch off turns the depletion mode power switch off, and switching the enhancement mode power switch on turns the depletion mode power switch on.

Optionally, the depletion mode power switch comprises a parasitic capacitance, and when the enhancement mode power switch is switched off a capacitive current associated with the parasitic capacitance charges the energy storing element via the second path.

Optionally, when the enhancement mode power switch is switched on the inductor current charges the energy storing element via the second path.

Optionally, the switching converter comprises a capacitor connected in parallel to the depletion mode power switch.

Optionally, the switching converter comprises a control circuit coupled to the enhancement mode power switch, wherein the energy storing element is adapted to provide energy to the control circuit.

Optionally, the switching converter comprises a protection circuit adapted to limit a voltage across the depletion mode power switch.

Optionally, the protection circuit comprises a Zener diode or a depletion mode transistor couple to the energy storing element.

Optionally, the converter may be made at least in part based on a III/V semiconductor.

Optionally, the depletion mode power switch is based on a III/V semiconductor. For example, the III/V semiconductor may comprise Gallium Nitride.

According to a second aspect of the disclosure, there is provided a method of powering a switching converter comprising an energy storing element, the method comprising providing a depletion mode power switch coupled to an enhancement mode power switch via a switching node; and charging the energy storing element via a first path coupling the depletion mode power switch to the energy storing element, wherein the first path comprises a resistance.

Optionally, the method comprises providing a second path coupling the depletion mode power switch to the energy storing element, wherein the second path comprises a coupling switch.

Optionally, the method comprising charging the energy storing element via the first path in a first mode of operation, and charging the energy storing element via the second path in a second mode of operation.

Optionally, the depletion mode power switch comprises a parasitic capacitance, and the method comprises switching the enhancement mode power switch off to turn the depletion mode power switch off, and charging the energy storing element using a capacitive current associated with the parasitic capacitance via the second path.

Optionally, the method comprises providing an inductor current and switching the enhancement mode power switch on to turn the depletion mode power switch on, such that the inductor current charges the energy storing element via the second path.

The options described with respect to the first aspect of the disclosure are also common to the second aspect of the disclosure.

BRIEF DESCRIPTION OF THE DRAWINGS

The disclosure is described in further detail below by way of example and with reference to the accompanying drawings, in which.

DESCRIPTION

Figure 1:
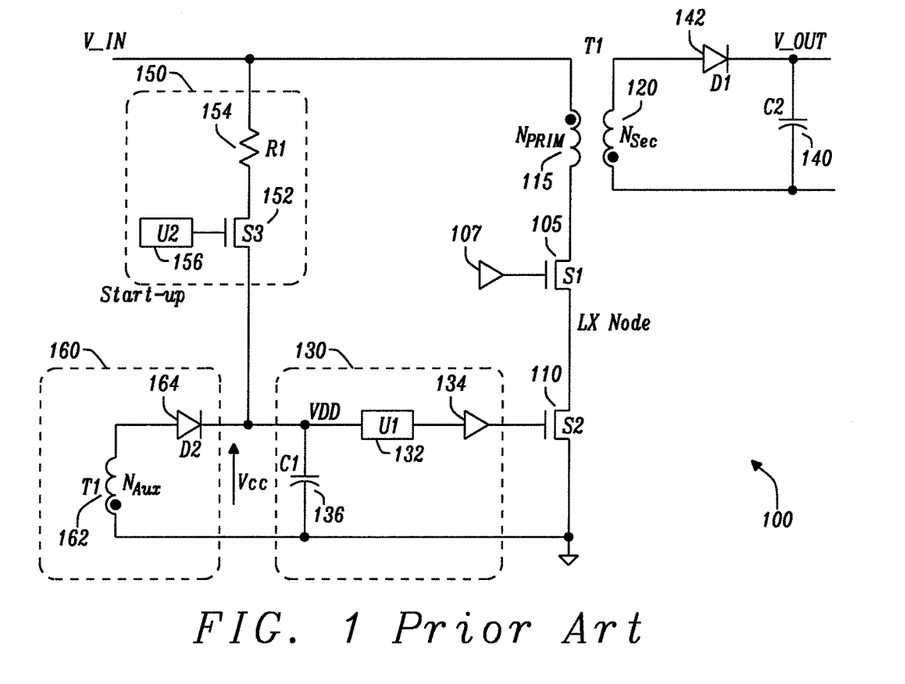
FIG. 1 is a diagram of a fly-back converter according to the prior art.

FIG. 1 illustrates a conventional fly-back power converter 100 for providing an output voltage Vout to a load. The circuit 100 includes a so-called half-bridge formed by a high side power switch 105 coupled to a low side power switch 110 via a switching node LX. The power switches 105 and 110 are provided by two N-channel enhancement mode transistors. The gate of the power switch 105 is connected to a driver 107 for providing a drive voltage of about 15V. A transformer T1 has a primary winding 115 magnetically coupled to a secondary winding 120. The primary winding 115 is coupled at one end to the high side power switch 105 and at another end to the input voltage Vin. The secondary winding 120 is coupled in parallel to an output capacitor C2 140. A diode D1, 142 is provided between the secondary winding 120 and the output capacitor 140.

A low side circuit 130 is provided for controlling the low side power switch 110. The low side circuit includes a controller U1 132 connected to a driver 134, and a capacitor C1 136 for powering the low side circuit. The low side power switch 110 has a first terminal coupled to the switching node LX, a second terminal coupled to the ground and a third terminal coupled to the low side driver 134.

A first internal-power supply circuit also referred to as start-up circuit 150 is formed by a depletion transistor S3 152 connected in series with a current limit resistor R1 154. The depletion transistor is controlled by a controller U2 156. A second internal-power supply circuit 160 includes an auxiliary winding 162 of transformer T1 connected to a diode D2 164. The auxiliary winding 162 has the necessary number of turns ratio to provide a regulated voltage Vcc.

At start up, the capacitor C1 136 is initially discharged, and the controller U1 is turned off as it requires a regulated voltage $V_{CC}$ in order to operate correctly. When an input V_IN is applied to the power converter 100, the transistor S3 152 is in a conductive state and a current charges C1. Once the voltage across C1 136 reaches the start up voltage, the controller U1 132 begins to operate and initiates the switching cycles. The controller U1 provides output regulation by controlling the ON and OFF state of switching transistor S2 110 via the driver 134. Once the on-off switching cycles occur, the second $V_{CC}$ circuit 160 begins to operate, taking on the primary role of providing the voltage $V_{CC}$ across the capacitor C1 136. Once the second circuit 160 is operational, the first circuit 150 is turned off by switching off the highly dissipative transistor S3 152. The circuit 100 is relatively complex and cumbersome.

Figure 2:
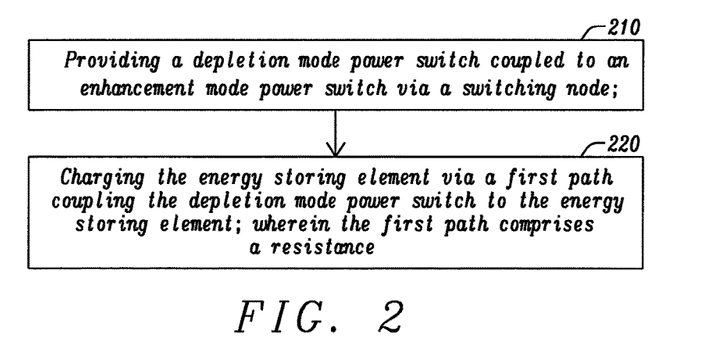
FIG. 2 is a flow chart of a method for powering a switching converter.

FIG. 2 is a flow chart of a method of powering a switching converter comprising an energy storing element. At step 210, a depletion mode power switch coupled to an enhancement mode power switch via a switching node is provided. For example, the depletion mode power switch may be a high-side power switch and the enhancement mode power switch may be a low-side power switch.

At step 220, the energy storing element is charged via a first path coupling the depletion mode power switch to the energy storing element. The energy storing element may be an internal capacitor for powering energy consuming parts of the switching converter. For example, the energy storing element may be an internal power supply for providing energy to a controller controlling the enhancement mode power switch. The first path comprises a resistance. The resistance allows to charge the energy storage element with an appropriate voltage. Using this approach, it is possible to simplify the design of the switching converter by reducing the number of components.

The first path may comprise a coupling switch. The resistance of the firth path may include an internal resistance of the coupling switch. Optionally, the resistance of the firth path may also include an additional resistance for protecting the coupling switch and the depletion switch.

Figure 3:
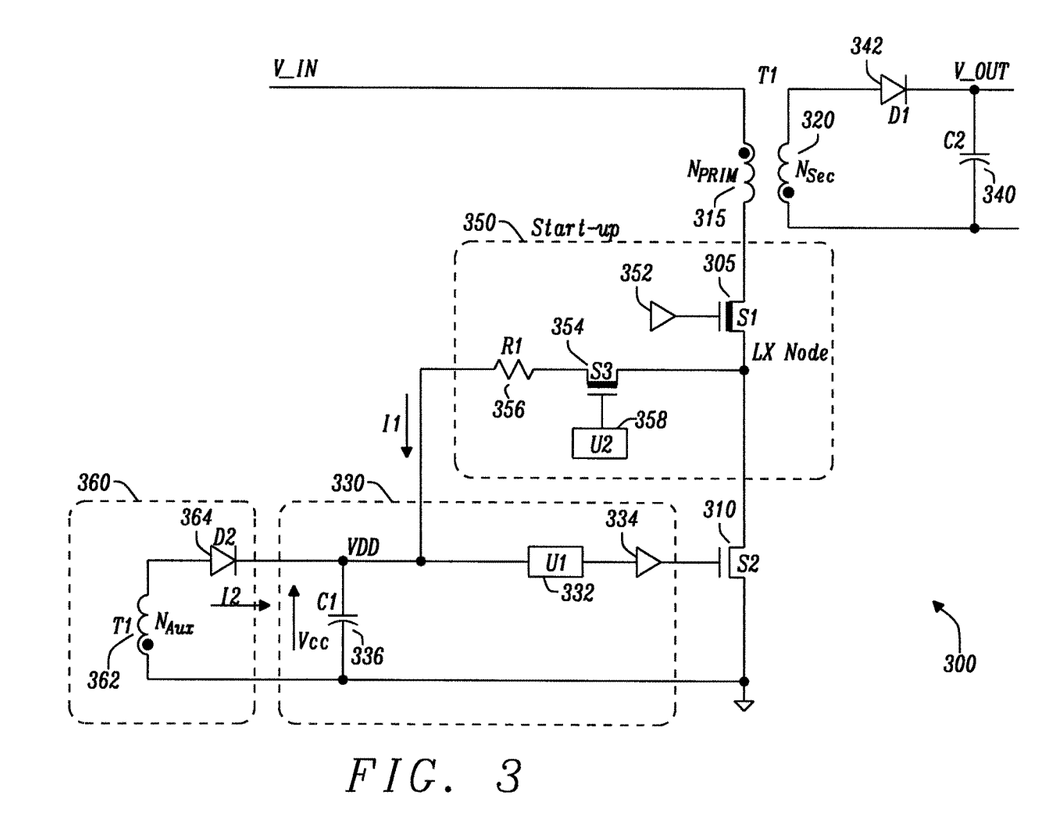
FIG. 3 is a diagram of a switching converter for implementing the method of FIG. 2.

FIG. 3 illustrates a diagram of switching converter 300 for implementing the method of FIG. 2. In this example, the switching converter 300 is a fly-back converter. The converter 300 includes a half-bridge formed by a high side power switch 305 coupled to a low side power switch 310 via a switching node LX. The high side power switch is provided by a depletion mode transistor and the low side power switch is provided by an enhancement mode transistor.

A transformer T1 has a primary winding 315 magnetically coupled to a secondary winding 320. The primary winding 315 is coupled at one end to the high side switch 305 and at another end to the input voltage Vin. The secondary winding 320 is coupled in parallel to an output capacitor C2 340. A diode D1, 342 may be provided between the secondary winding 320 and the output capacitor 340.

A low side circuit 330 is provided for controlling the low side power switch 310. The low side circuit includes a controller U1 332 connected to a driver 334, and a capacitor C1 336 for powering the low side circuit. The capacitor C1 336 has a first terminal coupled to the controller 332 and a second terminal coupled to a ground.

The high side power switch 305 has a first terminal, for example a drain terminal coupled to the primary winding 315, a second terminal, for example a source terminal coupled to the switching node, and a third terminal for example a gate terminal coupled to a high side driver 352. Alternatively, the gate terminal may be coupled to a ground. The high side power switch 305 is coupled to the capacitor C1 336 via a switch S3 354, also referred to as coupling switch. For example, the switch S3 may be a depletion mode transistor. In an alternative embodiment the switch S3 may be provided by another type of transistor. Optionally, a resistor 356 may be provided in series between the capacitor C1 336 and the coupling switch 354. The resistance R1 356 may be used to protect the high side power switch 305 and/or the coupling switch S3 354 by limiting a current flow. A controller U2 358 is coupled to the coupling switch S3 354. The high side power switch 305, the coupling switch S3 354, the controller 358 and the optional resistance R1 356 form a first internal power supply circuit, also referred to as start-up circuit 350 for charging the capacitor C1 336.

The low side power switch 310 has a first terminal, for example a drain terminal coupled to the switching node LX, a second terminal, for example a source terminal coupled to the ground and a third terminal, for example a gate terminal coupled to the low side driver 334. A second internal-power supply circuit 360 is provided by an auxiliary winding 362 of transformer T1 coupled to a diode D2 364. The auxiliary winding 360 has the necessary number of turns ratio to provide a regulated voltage Vcc.

At start up, the capacitor C1 336 is initially discharged, and the controller U1 is turned off. When an input V_IN is applied to the power converter 300, the transistor S3 354 is in a conductive state and a current I1 charges C1. The charge time of the capacitor C1 is a function of the current I1 in the resistance R1 356 and the capacitance of C1 336. Once the voltage across C1 336 reaches the start-up voltage, the controller U1 332 begins to operate and initiates the switching cycles. The controller U1 332 provides output regulation by controlling the ON and OFF state of the low side power switch 310 via the driver 334. The low side power switch 310 is used to control the voltage of the source terminal of the high side power switch 305. Switching the enhancement mode transistor 310 off, turns the depletion mode transistor 305 off. Similarly, switching the enhancement mode transistor 310 on, turns the depletion mode transistor 305 on. Once the second internal-power supply circuit 360 is operational, hence when it can provide a current I2 to the capacitor 336, the controller U2 358 turns the coupling switch S3 354 off to prevent power dissipation. The coupling switch S3 may be a bidirectional transistor to prevent discharge of the capacitor C1 in reverse conduction mode via S3 and S2 when S2 is turned on (closed).

By incorporating the high side depletion mode transistor as part of the startup circuit, it is possible to simplify the design of the power converter and to reduce production cost. Using this approach there is no need for additional start up components and the gate control is simple.

Figure 4:
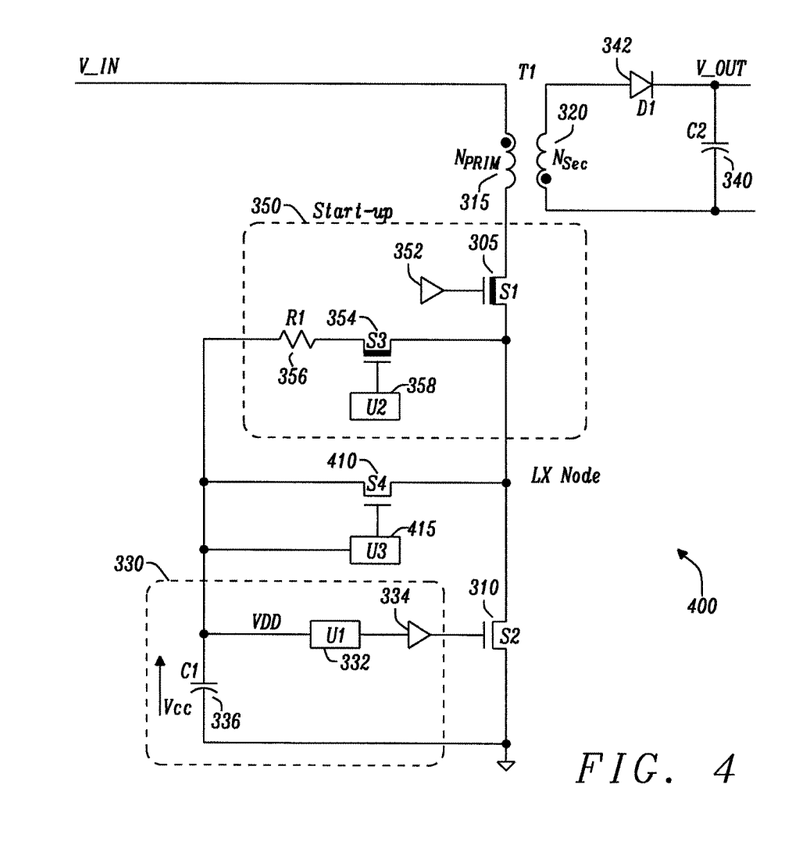
FIG. 4 is a diagram of switching converter provided with two charging paths for charging an internal power supply of the converter.

FIG. 4 illustrates a diagram of another switching converter 400 for implementing the method of FIG. 2. The fly-back converter 400 shares many similar components to those illustrated in the circuit 300 of FIG. 3. The same reference numerals have been used to represent corresponding components and their description will not be repeated for sake of brevity.

In this example, the second Vcc circuit is formed by a switch S4 410 coupled to a controller U3 415. The switch S4 410 has a first terminal coupled to the switching node LX, a second terminal coupled to the capacitor C1 336, and a third terminal coupled to the controller U3 415. The controller U3 415 may be powered by the capacitor C1. The switches S3 354 and S4 410 may be bidirectional transistors to prevent discharge of the capacitor C1 in reverse conduction mode via S3 and S2 or S4 and S2 when S2 is turned on (closed).

The operation of the circuit 400 is similar to the operation of the circuit 300 of FIG. 3. However, in the circuit 400 there is no need for the auxiliary winding 362 and the diode 364. Instead the energy used to maintain the voltage Vcc is extracted from the switching node LX. The controller U3 415 is adapted to maintain the voltage regulation Vcc across the capacitor C1. Once the switch S4 410 is operational, the controller U2 358 turns the switch S3 354 off to prevent power dissipation.

Once the controller U1 332 is suitably powered by the capacitor C1 336, it becomes operational, and the enhancement mode transistor S2 310 is switched on and off via the driver 334. Switching the enhancement mode transistor 310 off, turns the depletion mode transistor 305 off. Similarly, switching the enhancement mode transistor 310 on, turns the depletion mode transistor 305 on. When the enhancement mode transistor 310 is switched on an inductor current from the primary inductor 315 charges the capacitor C1 via the switch S4 410. However, when the enhanced mode transistor 310 is switched off a parasitic capacitance of the depletion mode transistor 305 provides a capacitive current to the capacitor C1 via the switch S4 410. Using this approach there is no need for an auxiliary winding circuit.

Figure 5:
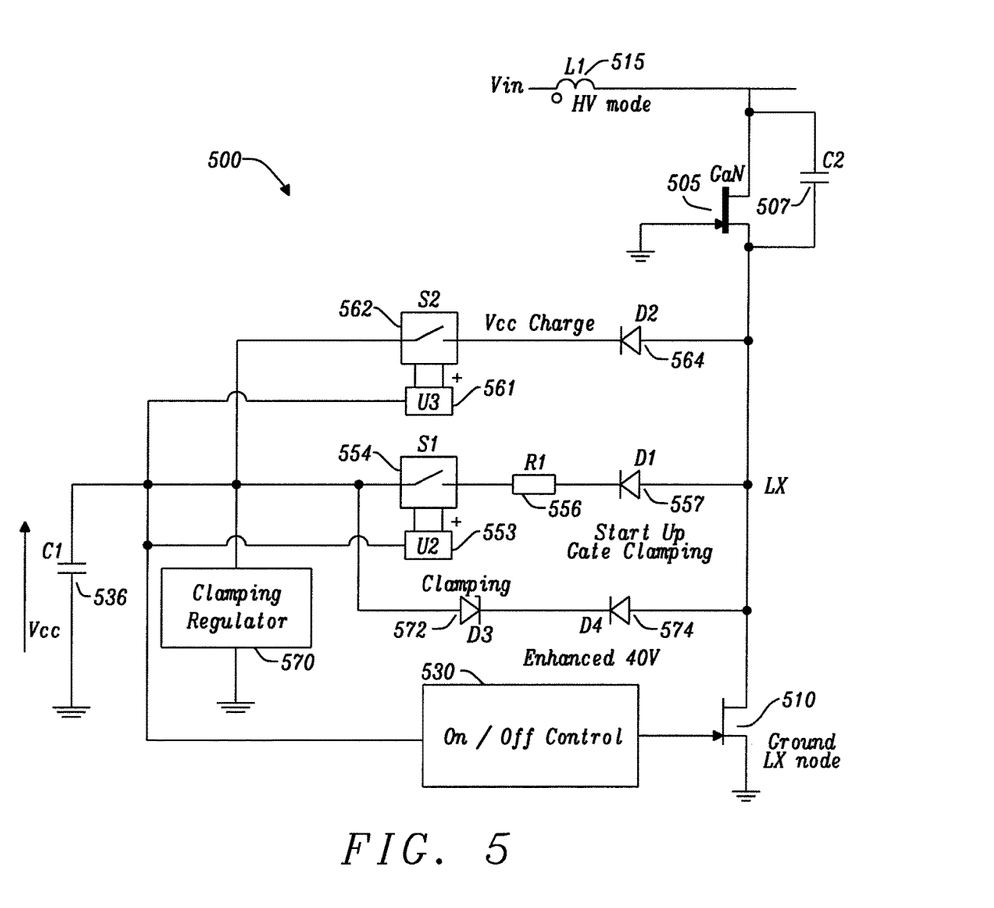
FIG. 5 is a diagram of a switching converter provided with a clamping circuit.

FIG. 5 illustrates another switching converter 500 for implementing the method of FIG. 2. The converter 500 includes a high side power switch 505 coupled to a low side power switch 510 via a switching node LX. The high side power switch may be provided by a GaN depletion mode transistor. The low side power switch may be provided by a GaN enhancement mode transistor or by an enhancement mode metal-oxide-semiconductor field-effect transistor (MOSFET). An inductor L1 515 is coupled at one end to the high side switch 505 and at another end to an input voltage Vin.

A low side circuit 530 is provided for controlling the low side power switch 510. The low side power switch 510 has a drain terminal coupled to the switching node LX, a source terminal coupled to the ground and a gate terminal coupled to the low side circuit 530. A capacitor C1 536 is provided for powering the low side circuit 530 as well as the controllers U2 553 and U3 561 controlling the switches 554 and 562 respectively.

The high side power switch 505 has a drain terminal coupled to the inductor L1 515, a source terminal coupled to the switching node LX, and a gate terminal coupled a ground. Optionally, an additional capacitor 507 may be provided between the drain and the source of the depletion transistor 505. The threshold voltage, Vgsth, of a GaN depletion mode transistor, may be about −6V. In FIG. 5, the gate of the transistor 505 is connected to the ground, however the gate could be connected to another potential as long as Vgs is greater than the threshold voltage.

The high side power switch 505 is coupled to the capacitor C1 336 via two charging paths. The first path also referred to as start-up path includes a first switch S1 554 coupled in series with a resistance R1 556 and a diode D1 557. The resistance R1 556 may be used to protect the high side power switch 305 and/or the switch S1 554 by limiting a current flow. A controller U2 553 is provided to control the first switch S1 554. For example, the first switch may be a GaN depletion mode transistor. The second path includes a second switch S2 562 coupled in series with a diode 564. A controller U3 561 is provided to control the second switch S2 562. For example, the second switch may be a GaN transistor. The second switch 562 may be an enhancement mode transistor E HEMT, with its gate terminal coupled to its drain terminal.

A clamping circuit may be provided to protect the high-side power switch 505 against an over current. The clamping circuit may include a clamping regulator 570, a Zener diode D3 572 and a diode D4 574. The Zener diode 572 has a first terminal coupled to the first switch S1 554 and a second terminal coupled to the diode D4 574. The diode D4 574 has a first terminal coupled to Zener diode 572 and a second terminal coupled to the switching node LX. The clamping regulator 570 may be provided in parallel with the capacitor C1 536, to regulate a supply voltage. For instance, the clamping regulator 570 may be implemented as a Zener diode. The diodes D2 564, D1 557 and D4 574 are optional and provided to prevent discharge of the capacitor C1 when the low side power switch 510 is on (closed).

Upon starting an input voltage Vin is applied to the converter. The depletion transistors 505 and 554 are on, and the capacitor C1 536 charges through the first path via diode D1 557, resistance R1 556 and first switch S1 554. The charge time of the capacitor C1 is a function of the current in the resistance R1 556 and the capacitance of C1 536. Once the capacitor C1 is sufficiently charged to power the other power consuming elements of the converter, the on-off switching cycle of the converter can start. For example, the capacitor C1 may be charged to +6V. During on-off switching, the converter is considered to be in a normal mode of operation. During such a normal mode, the switch S1 554 is open.

If the voltage Vcc across C1 536 drops below a certain value, part of the energy provided by the inductor L1 515 can be used for charging C1 via the second path by switching on the switch S2 562. Also, when the drain of the depletion-mode transistor 505 increases, the capacitor C2 507 acts as a charge-pump circuit. Therefore, the capacitive current from C2 can be used to charge C1 via S2. If the output capacitance also referred to as parasitic capacitance of the depletion-mode transistor 505 is large enough, the additional capacitor C2 507 is not required. If needed, C1 can also be recharged by closing momentarily the switch S1 554.

The clamping circuit which includes the Zener diode D3 572 is used to limit the drain source voltage of the the GaN depletion-mode transistor 505, hence protecting it again voltage overstress.

Figure 6:
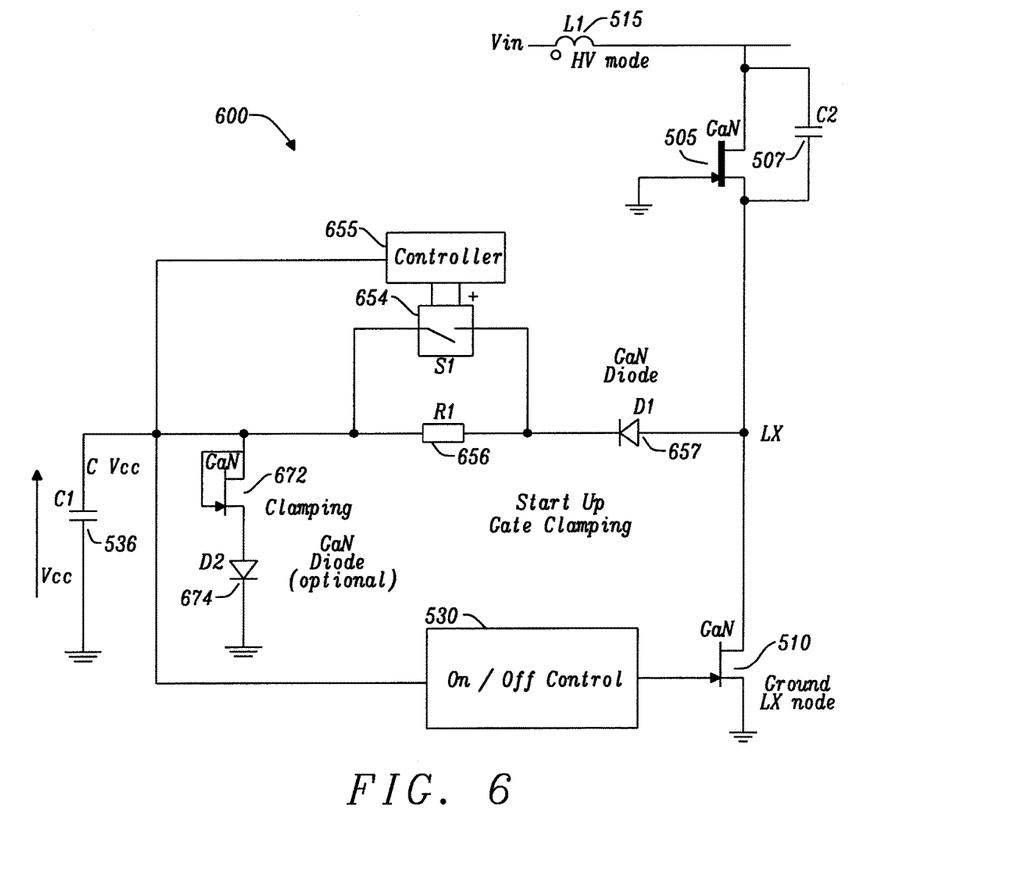
FIG. 6 is a diagram of yet another switching converter provided with a clamping circuit.

FIG. 6 illustrates a simpler version of the circuit 500 of FIG. 5. The converter 600 of FIG. 6 shares many similar components to those illustrated in the circuit 500 of FIG. 5. The same reference numerals have been used to represent corresponding components and their description will not be repeated for sake of brevity.

The high side power switch 505 is coupled to the capacitor C1 536 by a first path that includes a diode D1 657 in series with a resistance R1 656. A second path is provided by the diode D1 657 and a switch S1 654 coupled in parallel to the resistance R1 656. A controller 655 is provided to control the switch S1 654. For example, the switch S1 654 may be an enhancement mode transistor.

A clamping circuit is provided by a clamp transistor 672. For example, the clamp transistor may be a GaN enhancement mode transistor having a drain terminal coupled to the resistance R1, and a source terminal coupled to the ground via an optional diode D2 674. The gate and the drain terminals of the clamp transistor 672 are coupled.

At start up the switch S1 654 is open, and the capacitor C1 charges through the diode D1 657 and the resistance R1 656. In normal mode operation, the switch S1 is closed and the capacitor C1 can recharge using a capacitive current via the diode D1 657 and the switch S1 654. The capacitive current may be provided by the drain-source capacitor of the high side switch 505 alone or by a combination of the drain-source capacitor and the additional capacitor C2 507 in parallel with the high side power switch. This approach permits to simplify the circuit design, by reducing further the number of components.

Any of the circuit described above with reference to FIGS. 3, 4, 5, and 6 may be implemented wholly, or in part based on III/V semiconductors such as Gallium Nitride, GaN. The GaN transistors display a relatively low on-resistance and can achieve higher switching speed compared to their silicon-based counterpart. As such, GaN transistors are well suited for the design of fast power switching converters. GaN depletion-mode transistors have better performance compared to GaN enhancement-mode transistors. Therefore, the use of GaN depletion mode transistors improves the overall performance of the converter.

A skilled person will appreciate that variations of the disclosed arrangements are possible without departing from the disclosure. The switching converter described above is not limited to fly-back topology and could be applied to any other type of switching converter using a half-bridge configuration. For example, the circuit could be used with a boost converter, or a buck-boost converter. Accordingly, the above description of the specific embodiment is made by way of example only and not for the purposes of limitation. It will be clear to the skilled person that minor modifications may be made without significant changes to the operation described.

What is claimed is:

1. A switching converter comprising:
   a depletion mode power switch coupled to an enhancement mode power switch via a switching node;
   an energy storing element coupled to the depletion mode power switch via a first path; wherein the first path comprises a resistance; and
   a second path coupling the depletion mode power switch to the energy storing element, the second path comprising a coupling switch.

2. The switching converter as claimed in claim 1, comprising an inductor coupled to the depletion mode transistor, the inductor being adapted to provide an inductor current.

3. The switching converter as claimed in claim 1, wherein the first path comprises another coupling switch.

4. The switching converter as claimed in claim 3, wherein the resistance comprises an internal resistance of the said another coupling switch.

5. The switching converter as claimed in claim 3, wherein the said another coupling switch is a depletion mode transistor.

6. The switching converter as claimed in claim 1, wherein the converter is adapted to charge the energy storing element via the first path in a first mode of operation, and via the second path in a second mode of operation.

7. The switching converter as claimed in claim 1, wherein the enhancement mode power switch and the depletion mode power switch are arranged such that switching the enhancement mode power switch off turns the depletion mode power switch off, and switching the enhancement mode power switch on turns the depletion mode power switch on.

8. The switching converter as claimed in claim 1, wherein the depletion mode power switch comprises a parasitic capacitance, and wherein when the enhancement mode power switch is switched off a capacitive current associated with the parasitic capacitance charges the energy storing element via the second path.

9. The switching converter as claimed in claim 6, wherein when the enhancement mode power switch is switched on an inductor current charges the energy storing element via the second path.

10. The switching converter as claimed in claim 1, comprising a capacitor connected in parallel to the depletion mode power switch.

11. The switching converter as claimed in claim 1, comprising a control circuit coupled to the enhancement mode power switch, wherein the energy storing element is adapted to provide energy to the control circuit.

12. The switching converter as claimed in claim 1, comprising a protection circuit adapted to limit a voltage across the depletion mode power switch.

13. The switching converter as claimed in claim 12, wherein the protection circuit comprises a Zener diode or a depletion mode transistor couple to the energy storing element.

14. The switching converter as claimed in claim 1, wherein the depletion mode power switch is based on a III/V semiconductor.

15. A method of powering a switching converter comprising an energy storing element, the method comprising the steps of:
   providing a depletion mode power switch coupled to an enhancement mode power switch via a switching node;
   charging the energy storing element via a first path coupling the depletion mode power switch to the energy storing element, wherein the first path comprises a resistance; and
   providing a second path coupling the depletion mode power switch to the energy storing element, wherein the second path comprises a coupling switch.

16. The method as claimed in claim 15, further comprising the steps of: charging the energy storing element via the first path in a first mode of operation, and charging the energy storing element via the second path in a second mode of operation.

17. The method as claimed in claim 15, wherein the depletion mode power switch comprises a parasitic capacitance, the method comprising switching the enhancement mode power switch off to turn the depletion mode power switch off, and charging the energy storing element using a capacitive current associated with the parasitic capacitance via the second path.

18. The method as claimed in claim 15, further comprising the steps of: providing an inductor current and switching the enhancement mode power switch on to turn the depletion mode power switch on, such that the inductor current charges the energy storing element via the second path.

\* \* \* \* \*